United States Patent
Dubash

(10) Patent No.: US 11,281,584 B1
(45) Date of Patent: Mar. 22, 2022

(54) METHOD AND APPARATUS FOR CLONING DATA AMONG PERIPHERAL COMPONENTS AND A MAIN SYSTEM

(71) Applicant: CONCURRENT REAL-TIME, INC., Pompano Beach, FL (US)

(72) Inventor: Darius Rustomji Dubash, Coral Springs, FL (US)

(73) Assignee: CONCURRENT REAL-TIME, INC., Pompano Beach, FL (US)

( * ) Notice: Subject to any disclaimer, the term of this patent is extended or adjusted under 35 U.S.C. 154(b) by 0 days.

(21) Appl. No.: 17/373,417

(22) Filed: Jul. 12, 2021

(51) Int. Cl.
  *G06F 12/08*   (2016.01)
  *G06F 12/0831*   (2016.01)
  *G06F 13/16*   (2006.01)
  *G06F 12/02*   (2006.01)
  *G06F 30/20*   (2020.01)

(52) U.S. Cl.
  CPC ........ *G06F 12/0835* (2013.01); *G06F 12/023* (2013.01); *G06F 13/1668* (2013.01); *G06F 30/20* (2020.01); *G06F 2212/303* (2013.01)

(58) Field of Classification Search
  CPC ........... G05B 2219/15056; G05B 2219/21097; G05B 2219/34196; G06F 13/1668; G06F 12/023; G06F 3/20; G06F 2212/303; G06F 15/17331; G06F 2213/2806; G06F 12/0835; G06F 12/1081
  See application file for complete search history.

(56) References Cited

U.S. PATENT DOCUMENTS

| | | | |
|---|---|---|---|
| 5,812,880 A * | 9/1998 | Goto ................. | G05B 19/0421 710/14 |
| 2001/0018719 A1 | 8/2001 | Francis | |
| 2009/0201926 A1* | 8/2009 | Kagan ................ | H04L 12/6418 370/389 |
| 2011/0060852 A1 | 3/2011 | Komatsu et al. | |

(Continued)

OTHER PUBLICATIONS

Reliable, Cheaper, and Modular New SCADA System for Wireless Remote Applications by Zahran (Year: 2011).*

(Continued)

*Primary Examiner* — Paul M Knight
(74) *Attorney, Agent, or Firm* — The Concept Law Group, PA; Scott D. Smiley; Scott M. Garrett

(57) ABSTRACT

A system include a main computing system, a first peripheral component, and a second peripheral component. The first peripheral component receives analog signals from a hardware elements in a first peripheral system and converts them digital signal values in a local memory. A local processor of the first peripheral component writes the signal values directly into a first memory space in the physical memory of main computing system using direct memory access. The main computing system uses the signal values to generate output signal values that it writes into a second memory space of the physical memory. A second peripheral component directly accesses the second memory space to read the output signal values, and writes the output signal values into a local memory. The second peripheral component generates output analog signals based on the output signal values and provides the analog signals to hardware elements of a second peripheral system.

14 Claims, 6 Drawing Sheets

(56) References Cited

U.S. PATENT DOCUMENTS

| | | | | |
|---|---|---|---|---|
| 2013/0253706 | A1* | 9/2013 | Hada | G05B 19/18 |
| | | | | 700/275 |
| 2017/0269147 | A1* | 9/2017 | Rezgui | G01R 31/2834 |
| 2020/0371914 | A1* | 11/2020 | Wang | G06F 12/0804 |
| 2021/0263673 | A1* | 8/2021 | Norman | G06F 9/50 |
| 2021/0294496 | A1* | 9/2021 | Kotzur | G06F 3/065 |

OTHER PUBLICATIONS

NVDIMMs—A Perfect Blend of Memory and Storage by VIP Experts 2019 (Year: 2019).*
How Does Scatter/Gather Work? by Moyer (Year: 2017).*
Difference Between Direct and Indirect Addressing Instruction by Rawat (Year: 2019).*
Persistent Memory Replication Over Traditional RDMA Part 1: Understanding Remote Persistent Memory by Gromadzki (Year: 2019).*
Using PCIe & intelligent DMA to achieve blazing data rates in real-time recording instruments (Year: 2011).*
Engine Control Unit (ECU) Technical Spec by Ecotrons (Year: 2019).*
Practical Modern SCADA Protocols: by Clarke (Year: 2004).*
CAN Interfacing to communicate to ECU of a vehicle using PIC micro-controller by ChansAlive (Year: 2013).*
PCI/PCIe Fieldbus Cards by Beckoff (Year: 2021).*
Fieldbus VS 4-20 MA—Acomprehensive Comparison by Ayllon (Year: 2020).*
Modular SGDMA Intel (Year: 2019).*

* cited by examiner

METHOD AND APPARATUS FOR CLONING DATA AMONG PERIPHERAL COMPONENTS AND A MAIN SYSTEM

FIELD OF THE INVENTION

The present invention relates generally to data transfer among components in a computing system, and, more particularly, relates to real-time direct data transfer from one peripheral system to a main system memory, and from the main system memory to another peripheral system.

BACKGROUND OF THE INVENTION

In a typical computing system it is common to interface a central processing unit (CPU) to one or more peripheral components. The CPU includes memory in which application programs can be instantiated and executed, as well as input/output interfaces for interfacing with displays, keyboards, pointing devices, etc. The applications running on the CPU can use data provided by peripheral components, as well as generate data to be used by peripheral components. Communication and data transfer between peripheral components and the CPU occur over a bus via programmed I/O or direct memory access (DMA), using an application programming interface (API). When an application program running on the CPU needs data from a peripheral component, the program makes a call through the API, and the peripheral component responds in due course. This necessarily requires more clock cycles than would be required if the processor of the CPU could access the peripheral component's data in directly in the CPU's own physical memory. For many types of application programs, the CPU overhead and access latency that is inherent in retrieving data through API calls for every transfer is not a concern, or at least it is within an acceptable margin. However, for systems that are real-time dependent, reducing latency and freeing up processor time would be highly desirable. For example, in complex real-time simulation systems, there can be a large amount of data being produced by peripheral components, as well as data that other peripheral components need from the CPU immediately in order to carry out operations in accordance with user input in a real-time manner. In such applications, API calls for every transfer of data create an undesirable restriction in time and processing load on the CPU.

Therefore, a need exists to overcome the problems with the prior art as discussed above.

SUMMARY OF THE INVENTION

In accordance with some embodiments of the inventive disclosure, there is provided a method for cloning data in a real-time simulator system that includes defining, in a local memory of a first peripheral device, a range of memory locations of the local memory to be cloned. The method further includes receiving, at the first peripheral device, a plurality of signals produced by one or more physical components of a first peripheral system. The method also includes converting, by the first peripheral system, the plurality of signals produced by the physical components of a first peripheral system to a corresponding plurality of signal values and storing each one of the signal values in a respective assigned one of the range of memory locations of the local memory of the first peripheral device. The method can further include defining, in a memory of a main computing system, a dedicated memory space corresponding in size to the range of memory locations defined in the local memory of the first peripheral device, wherein each one of the plurality of signal values of the first peripheral system are mapped to respective memory location in the dedicated memory space in the memory of the main computing system. The method further includes writing, by a local processor on the first peripheral device, the signal values from the range of memory locations of the local memory of the first peripheral device directly to the dedicated memory space over a common bus of the main computing system.

In accordance with a further feature, writing to the dedicated memory space comprises writing to a dedicated memory space in a random access memory.

In accordance with a further feature, the common bus is a peripheral component interface bus.

In accordance with a further feature, writing directly to the dedicated memory space comprises writing to a processor cache of a processor of the computing system.

In accordance with a further feature, writing to the dedicated memory space in the physical memory is performed asynchronously and continuously by the local processor of the first peripheral device.

In accordance with a further feature, defining the range of memory locations of the local memory to be cloned is performed by a processor of the main computing system configuring the first peripheral device using an application programming interface.

In accordance with a further feature, the method further includes generating, by a processor of the main computing system, a plurality of output signal values for a second peripheral system that is, at least in part, based on the signal values in the first dedicated memory space. The method further includes the processor of the main computing system writing the plurality of output signal values for the second peripheral system in a second dedicated memory space of the main computing system. The method further includes a local processor of a second peripheral component directly accessing the second dedicated memory space to read from the second dedicated memory space. The method further includes the local processor of the second peripheral system writing output signal values of the plurality of output signal values read from the second dedicated memory space into corresponding memory locations in a local memory of the second peripheral component.

In accordance with a further feature, the method further includes providing each one of the output signal values in the local memory of the second peripheral component to a respective one of a plurality of D/A channels of the second peripheral component. The method further includes each one of the plurality of D/A channels generating an analog output based on the respective output signal value. The method further includes providing the analog output of each D/A channel to a respective hardware component of the second peripheral system.

In accordance with some embodiments of the inventive disclosure, there is also provided a method for cloning data between a peripheral domain and a user domain operated on a main system, the peripheral component being interfaced with the main system by a bus system, the method including configuring a peripheral component, through an application programming interface, by the main system, to directly write data in a plurality of local memory locations of the peripheral component to specified physical memory locations of the main system on an ongoing asynchronous basis. The method further includes generating data by the peripheral component at the local memory locations of the peripheral component. The method further includes the peripheral component generating a plurality of signal values from hardware elements, and wherein each of the plurality of signal values are written into an assigned respective memory location of the local memory location. The method further includes the peripheral component writing the signal data of the local memory locations to the specified physical memory locations of the main system over the bus system using a modular scatter gather engine. The method further includes a processor of the main system accessing the signal data in the specified physical memory locations using direct addressing to generate output signal values based on the signal data for a second peripheral system.

In accordance with a further feature, writing to the specified physical memory locations comprises writing to a random access memory.

In accordance with a further feature, the bus is a peripheral component interface bus.

In accordance with a further feature, writing directly to the specified memory locations comprises writing to a processor cache of a processor of the computing system.

In accordance with a further feature, writing to the specific physical memory location in the physical memory is performed asynchronously and continuously by a local processor of the first peripheral component.

In accordance with a further feature, the method further includes the processor of the main computing system writing the plurality of output signal values for the second peripheral system in a second dedicated memory space of the main computing system. The method further includes a local processor of a second peripheral component directly accessing the second dedicated memory space to read from the second dedicated memory space. The method further includes the local processor of the second peripheral system writing output signal values of the plurality of output signal values read from the second dedicated memory space into corresponding memory locations in a local memory of the second peripheral component.

In accordance with a further feature, the method further includes providing each one of the output signal values in the local memory of the second peripheral component to a respective one of a plurality of D/A channels of the second peripheral component. The method further includes each one of the plurality of D/A channels generating an analog output based on the respective output signal value. The method further includes providing the analog output of each D/A channel to a respective hardware component of the second peripheral system.

In accordance with some embodiments of the inventive disclosure, there is also provided a system that includes a main computing system having a processor, a physical memory, and a bus, the processor used to execute an application program. The physical memory has defined therein a first dedicated memory space and a second dedicated memory space. The system further includes a first peripheral component that is interfaced with the bus of the main computing system and having a local processor, a local memory, and a analog to digital (A/D) converter system that includes a plurality of A/D channels, each one of the plurality of A/D channels configured to receive a respective analog signal from a hardware element of a first peripheral system and produce a signal value that is provided to a respective memory location in the local memory, wherein the local processor is configured to directly write the signal values in the local memory to corresponding memory locations in the first dedicated memory space using direct memory access on an ongoing and asynchronous manner. The system further includes the processor of the main computing system being configured to read the signal values in the first dedicated memory space and generate a plurality of output signal values that are written into respective locations of the second dedicated memory space. The system further includes a second peripheral component that is interfaced with the bus of the main computing system and having a local processor, a local memory, and a digital to analog (D/A) converter system that includes a plurality of D/A channels, the local processor of the second peripheral component configured to directly read from the second dedicated memory space and write the plurality of output signal values into respective locations in the local memory of the second peripheral component, each one of the respective locations in the local memory being associated with a respective one of the plurality of D/A channels, and wherein each one of the plurality of D/A channels produces an analog output having a value proportional to the respective one of the output signal values in the respective one of the memory locations.

Although the invention is illustrated and described herein as embodied in a real-time computing system, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

"In the description of the embodiments of the present invention, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second", "third" and so on are only used for descriptive purposes, and cannot be construed as indicating or implying relative importance.

In the description of the embodiments of the present invention, it should be noted that, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, a "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system. Those skilled in the art can understand the specific meanings of the above-mentioned terms in the embodiments of the present invention according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

DETAILED DESCRIPTION

Figure 1:
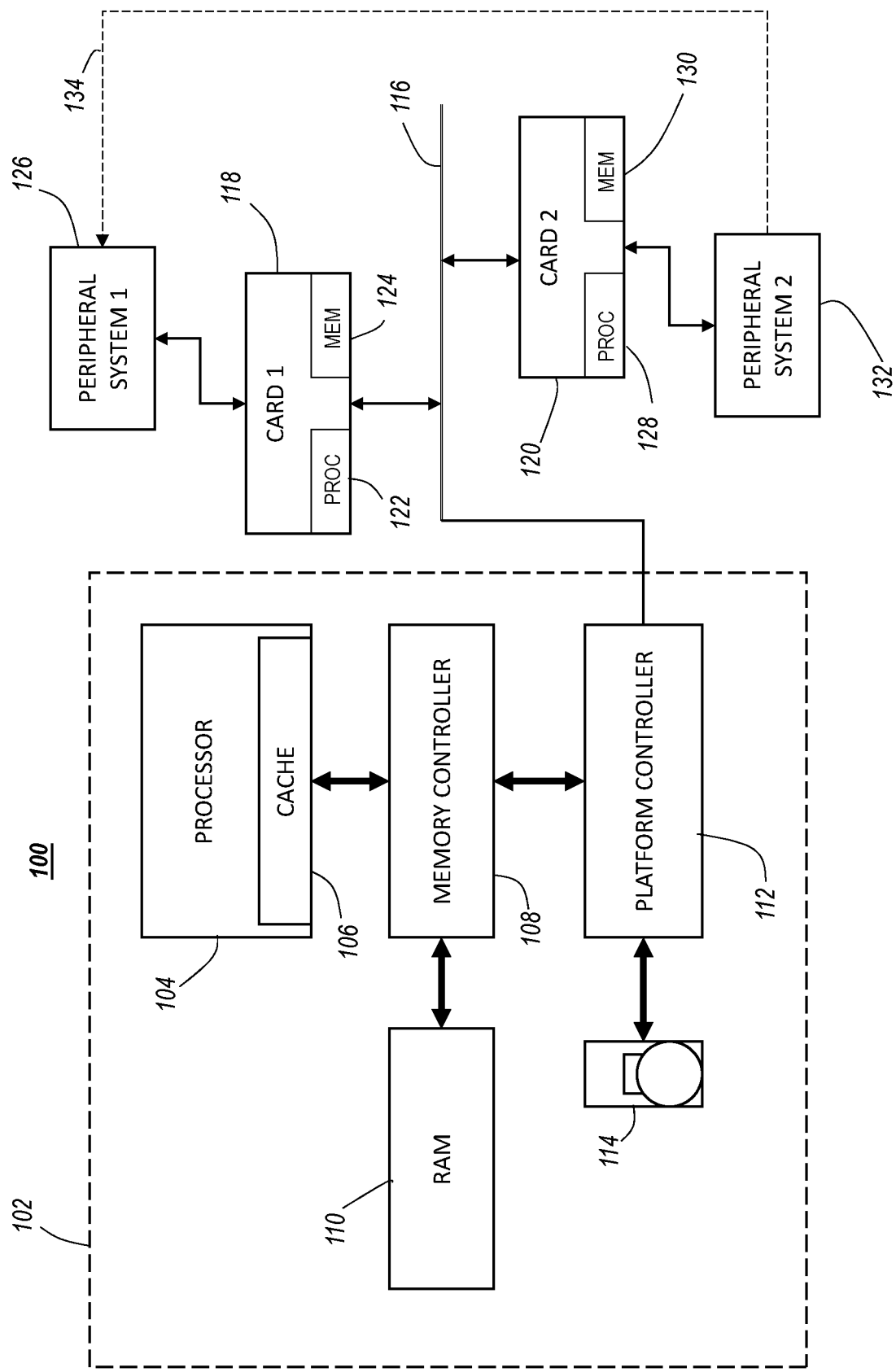
FIG. 1 is a system schematic diagram of a computing system having a main system portion and one or more peripheral system portions in which data is cloned from the peripheral system to the main system, in accordance with some embodiments.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

FIG. 1 is a system schematic diagram of a computing system 100 having a main system portion 102 and one or more peripheral system portions in which data is cloned from the peripheral system to the main system 102, in accordance with some embodiments. The main system 102 includes a processor 104 that can include a cache memory 106. The processor 104 is interfaced with a bus system including a memory controller 108 that can be further interfaced with a platform controller 112. The memory controller 108 and platform controller 112 are each bus controllers. For example the memory controller 108 can be a Northbridge controller and the platform controller 112 can be a Southbridge controller, as those terms are understood in the art. The memory controller 108 is a high speed bus controller and is interfaced to memory such as random access memory (RANI) 110 which can be dynamic RAM (DRAM), while the platform controller 112 is interfaced with a peripheral bus 116 which can be a peripheral component interface (PCI) bus. The platform controller 112 can be further interfaced to a bulk storage component 114 such as a hard drive, as well as a universal serial bus (USB), audio controllers, and other peripheral systems. The bulk storage component 114 is non-volatile and stores, for example, operating system code, application program code, and data (e.g. files, records, documents, etc.). As is well known in computer systems, the bulk storage component can be accessed upon start up to retrieve operating system code for instantiation in the memory 110. Likewise, application program code can be retrieved and instantiated in the memory 110 and the application program can allow a user to interact with, and control various system components using the application program through input/output devices connected to the main system (i.e. to the platform controller 112).

The main system 102 receives data from, and sends data to peripheral systems. For example, a first peripheral component or card 118 is connected to the peripheral bus 116. The first peripheral component 118 can be further interfaced with a first peripheral system 126. The first peripheral system 126 is an external system that includes, for example, its own hardware, controllers, sensors, input/output components. In some embodiments, the first peripheral system 126 can be an analog simulation system that produces analog data representing physical components of a vehicle, such as sensor output and other signals representing components of a simulated vehicle that is used to provide input data to the main system 102 and the application program being executed by the main system 102. In some embodiments, actual vehicle components can be used and controlled to test them in a simulated environment in the first peripheral system 126. These systems are responsive to output control signals, including navigation control (e.g. steering), engine control, and so on. A second peripheral system 132 is interfaced with a second peripheral component or card 120 that is connected to the peripheral bus 116. The second peripheral system 132 can represent an external system of controlled components, meaning components under user control that in turn produce an output 134 that can be fed back to the first peripheral system 126, such as by mechanical and/or electrical means. That is, physical elements of the second peripheral system 132 can act physically (mechanically, electrically) on physical elements of the first peripheral system 126. Thus, peripheral systems 126, 132 in this example, are analog systems that can include various mechanical and electrical components that are controlled by the main system 102 using a suitable application program. These systems 126, 132 can send and receive, both analog and digital signals to or from their respective component cards 118, 120. The cards 118, 120 provide analog and digital interfaces to their respective peripheral systems 126, 132 and further interface with the main system 102. Each of the cards 118, 120 contain their own processing elements for data and signals, and have their own firmware to operate the cards 118, 120 and properly interface with the peripheral systems 126, 132. The firmware can allow set up of the cards, including setting up direct data transfers to the memory of the main system, including the RAM 110 and processor cache 106. Thus, the main system 102 can configure the operation of each of the cards 118, 120 such as through APIs for each of the cards 118, 120.

In one example, the first peripheral system 126 produces data indicating the state of various peripheral devices or components, which can include mechanical elements being simulated. This data is used by an application program running in the main system 102 in a simulation environment that is responsive to user input to control components and then receive feedback as to their physical response in a system which is sensed using sensors that provide signals indicative of a physical parameter. Similarly, the application program can, responsive to processing data produced by the first peripheral system 126, produce data that is used by the second peripheral system 132. Some or all of the data produced by the application program can be based on the data produced by the first peripheral system 126, or it can be data originated by the application program in response to user input or settings. The second peripheral component card 120 is interfaced with the second peripheral system 132, and receives data from the main system 102 to control elements of the second peripheral system 132. The first peripheral component 118 and the second peripheral component 120 can each be cards that plugs into a respective bus socket connected to bus 116 (e.g. PCI or PCIe bus). Each of the cards can include local memory elements 124, 130, respectively, and a local processor 122, 128, respectively. The local processors 122, 128 can be used to each run a direct memory access engine for the respective card 118, 120 to transfer data to/from the local memory 124, 130 to the RANI 110 and/or processor cache 106 of the main system 102. Similarly, each local processor 122, 128 can be used to run its own local DMA engine to directly transfer data from its own local memory to the other cards local memory.

Under a conventional prior art system, the application program running on the main system 102 would send data to and from the peripheral systems 126, 132 using an API for every transfer of data. That is because the memory on the peripheral components 118, 120 is not directly addressable by the processor 104 of the main system 102. As a result, under the prior art systems there would be a certain setup, signaling and data transfer overhead, in clock cycles, necessary to receive or send data to and from the peripheral components for every transfer using the conventional API calls. That overhead in clock cycles would not be necessary if the data were, for example, in the RAM 110 or the processor cache 106 without using API calls, each of which can be directly addressed by the processor 104. In a real-time simulation system reduced data latency affects the integrity of the simulation, possibly avoiding overruns and the extra clock cycles associated with API calls. Thus, eliminating this processing load frees up processing resources to performing other computation activities. Accordingly, it is desirable to reduce data latency and the number of clock cycles necessary to access data from peripheral components, as well as sending data to peripheral components, in time-sensitive applications.

In accordance with the inventive disclosure, to reduce data latency and the processor load on the main system associated with the conventional prior art arrangement of using API calls for every transfer of data, each of the peripheral components 118, 120 can be set up to operate a direct memory access (DMA) engine, where data produced by the first peripheral component 118 is cloned from local memory 124 to a physical memory 106, 110 of the main system 102. Likewise, output data generated by the main system 102 that is required by the second peripheral component 120 is cloned from a physical memory 106, 110 of the main system 102 to the local memory 130 of the second peripheral component 120. The cloning processes, once initiated, are run by each of the peripheral components 118, 120, independently of the main system 102, freeing the processor 104 from having to perform continuous API calls to transfer data to or from the peripheral components 118, 120. The cloning operation can also be referred to as reflecting a "true mirror image" of the changing data in real-time. The data can be reflected in both directions, as well. Data in a local memory such as local memories 124, 130 can be reflected to the cache 106 and/or RANI 110, and some other data in the cache 106 and/or RANI 110 can be reflected to local memories 124, 130. In some embodiment the reflection or cloning can be in one direction only, so that, for example, data in memory 124 is reflected into RAM 110, and different data, produced by the processor 104, that is in RANI 110 can be reflected or cloned into local memory 130.

As a result, when the processor 104, in response to executing application program code, needs to access data that is produced by peripheral system 126 that is in memory 124 of the peripheral component 118, a copy of the data in memory 124 is available in the RAM 110 of the main system 102, which basically has close to zero overhead for the processor 104 to access the reflected data. Similarly, if the processor needs to write data to the local memory 130 of peripheral component 120, it only needs to write to its cloned area of its own RANI 110 with minimal overhead and the changes will be automatically reflected in the local memory 130 of the peripheral component 120 without the need for any API calls. Thus, a portion of RANI 110, and/or cache 106, is reserved by the application program and operating system of the main system 102 for the cloning operations for the cloning operations. These memory locations are provided to the peripheral components 118, 120 so that they can perform the cloning operations, rather than having the processor 104 perform API calls to each of the peripheral components 118, 120. For example, a portion of RAM 110 can be reserved for cloning/reflecting the data in local memory 124, and another portion of RAM 110 can be reserved to cloning/reflecting data into local memory 130. The cloning operations performed by local processors 122, 128 alleviate the processor 104 of the main system from having to make API calls to transfer data to/from the peripheral components 118, 120, allowing the processor 104 to perform other computation activity that is time-sensitive, and improving the responsiveness and accuracy of a real-time simulation being performed by the main system 102.

Figure 2:
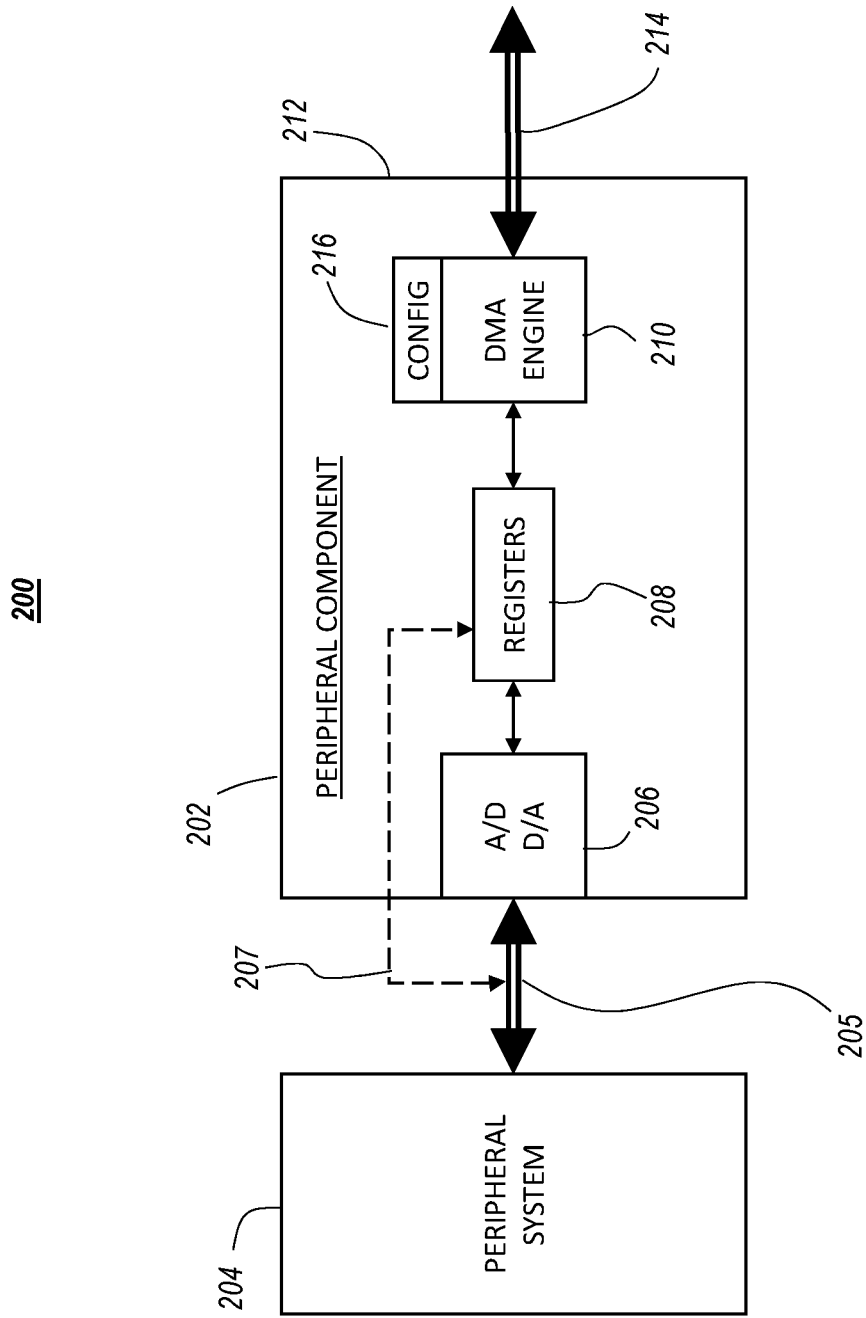
FIG. 2 is a block schematic diagram of a peripheral component interfaced to a peripheral system, where the peripheral component is configured to facilitate cloning of data produced by the peripheral system to a physical memory of the main system, in accordance with some embodiments.

FIG. 2 is a block schematic diagram 200 of a peripheral component 202 interfaced to a peripheral system 204, where the peripheral component 202 is configured to facilitate cloning of data produced by the peripheral system 204 to a physical memory of the main system, in accordance with some embodiments. The peripheral component 202 can be equivalent to peripheral component 118 or peripheral component 120 of FIG. 1. The peripheral system 204 can be an analog system with mechanical and/or electro-mechanical components that produce signals 205 (i.e. through transducers or other sensors) indicating a present state of several sub-systems, devices, and other parts that may be present in the peripheral system 204. Likewise, signals can flow in the opposite direction, from the peripheral component 202 to the peripheral system 204. Signal flow from the peripheral system 204 to the peripheral component 202 is discussed first. The signals can be analog or digital, or both. Analog signals produced by the peripheral system 204 are digitized by an analog to digital converter (A/D) 206 of the peripheral component, and then their digital value can be stored in an on-board local memory or register 208, or an equivalent memory element. That is, each one of the signals produced by the peripheral system is assigned to a specific location in the registers 208 and the values of each of the signals are continuously refreshed in the registers. Digital signals produced by the A/D 206 are directly stored in their assigned location in the registers 208. Digital signals 207 produced by the peripheral system 204 can bypass the A/D 206 and be written directly into their assigned location(s) in the registers 208. Thus, each signal produced by the peripheral system 204 is represented by a digital value that is stored at a respectively assigned location or address in the register memory 208.

A DMA engine 210 is a hardware processing circuit operated according to a configuration 216 that configures the DMA engine 210 to clone data that is in the registers 208 to a physical memory (e.g. 106 or 110) of the main system over a bus 214 that is connected to the memory of the main system. The operating system of the main system is likewise configured to permit the DMA engine 210 to access the particular memory location of the main system. The DMA engine 210 comprises a local processor on the peripheral component 202 that can access the bus 214 and write data to the specified allocated memory locations of the main system. Since the DMA engine clones/reflects the data to a physical memory of the main system, the main system can directly access the data in its physical memory without having to perform an API call to the registers 208 of the peripheral component 202 to have the data collected in response to the API call.

The DMA engine 210 operates according to a configuration 212 that indicates where, in the physical memory of the main system, the data is to be written along with the size of transfer. Specifically, each different data value representing a different signal from the peripheral system is mapped to a respective memory location in the physical memory of the main system. The configuration can be in the form of driver API call where parameters are stored locally on the peripheral component 202. This is typically a single time API call to configure and start the cloning process prior to performing simulation operations. The configuration 212 is established prior to the main program operation, on the main system, through an API that sets driver parameters to be used by the DMA engine 210 in the cloning operation. Once set up, the user initiates the cloning process which in turn causes the DMA engine to continuously and asynchronously reflect the data in the registers 208 to the physical memory locations of the main system specified in the configuration 212. Specifically, the DMA engine 210 asserts bus control and writes the data to the selected physical memory locations of the main system in an ongoing and continuous manner. The main system may preempt control of the bus, however, to access the memory. The physical memory locations of the main system can be, for example, locations in the system RAM (e.g. 110). During the configuration process, the main system reserves the RAM/cache memory locations for the data being cloned by the peripheral component 202.

The reverse situation can also occur, where data in the RAM/cache of the main system is reflected into the local memory of a peripheral component. That is, the DMA engine 210 can fetch data over the bus from the specified and reserved physical memory locations of the main system, and copy it into the registers 208. Then, rather than using an A/D 206, a digital to analog converter (D/A) is used to generate analog signals for the peripheral system 204.

In addition to setting up a single cloning operation in one direction or another as described earlier, the user may desire to perform cloning on multiple regions of memory each having a different address, size and direction. Once again, the configuration API can be set up ahead of the cloning operation to specify multiple cloning regions, e.g. the user could configure cloning of the local memory 124 on card 118 to the RAM 110 located in the main system so that data in the RANI 110 will be a "true mirror image" of the data in the local memory 124. Additionally, the user could also configure the cloning in the opposite direction by cloning another section of RAM 110 to a local memory 130 on card 120 where data in the local memory 130 will be a "true mirror image" of the data in the RAM 110. Once cloning operation commences, two regions of memory will be simultaneously cloned. The user application program on the main system 102 can at that point simply read the cloned region of local memory 124 in RAM 110, process the data, and then effectively write the resulting data to the cloned region of local memory 130, by the cloning process, with minimal overhead. In actuality, the resulting data produced by the main system is written into specific memory locations in the RAM 110, and the local processor 128 of the second card 120 fetched data from those memory locations and writes it into corresponding memory location (e.g. registers) in the local memory 130. In short, this cloning operation can incorporate several memory regions providing "true mirror images" simultaneously and is only limited by the imagination of the user. Though the overhead to transfer data between the cloned regions will still be minimal, the latency will be a function of the number of simultaneous cloned regions, their size and location.

Once the cloning and DMA parameters are set up by the driver in the configuration 212, the peripheral component 202 operates autonomously. Data in the registers 208 represent real-time signal values of corresponding signals provided by (or to) the peripheral system 204. The A/D can run autonomously, constantly updating values in the registers 208. Likewise, the DMA engine 210 continuously and autonomously copies data from the registers 208 into the specific memory locations (or reads it from the memory) of the main system, bypassing the CPU in the main system. This operation obviates the need for API calls for every transfer and reduces the processing load on the processor of the main system. The DMA engine 210 is a "bus master" which when initiated to perform a DMA operation "arbitrates" for the system bus for the duration of the transfer and then releases the bus to allow other devices to similarly access the bus. The data is transferred in "burst mode" to ensure quick transmission of data. This transfer occurs directly between the device and system memory 110 by the DMA acting as the "bus master" without passing through the main system CPU 104.

Figure 3A:
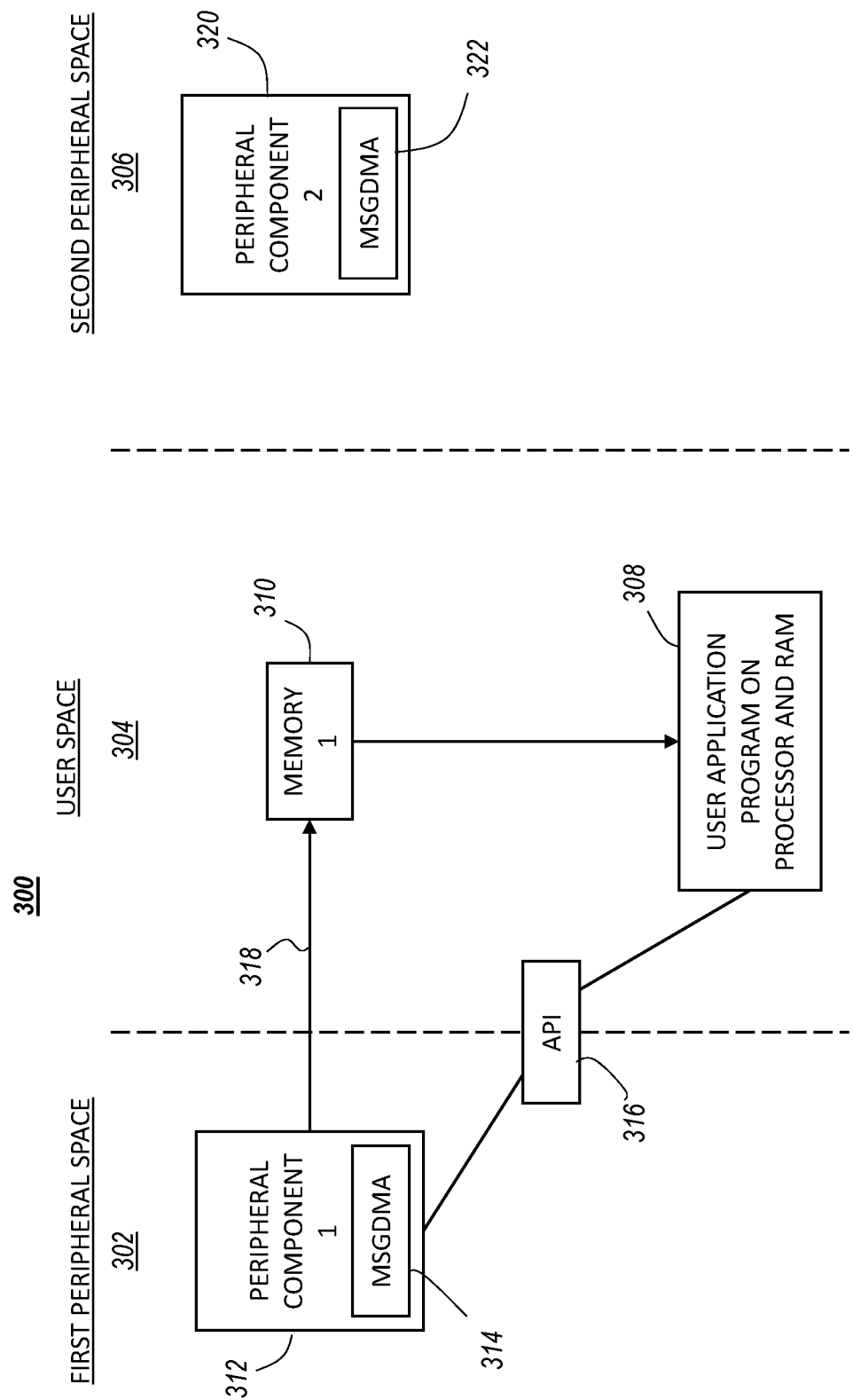
FIG. 3A is a system diagram showing cloning of data at a first peripheral component to physical memory of a main system, in accordance with some embodiment.

FIG. 3A is a system diagram 300 showing a process for cloning of data at a first peripheral component to physical memory of a main system, in accordance with some embodiments. In the system 300 there is shown a representation of a first peripheral space 302, a user space 304, and a second peripheral space 306. The user space 304 represents the main system and CPU running an application program having a user interface, such as main system 102 of FIG. 1. The main system can have conventional input/output and user interface components (e.g. mouse, keyboard, displays). The user space 304 is interfaced with the first and second peripheral spaces 302, 306 over one or more busses, such as PCI buses, which allow word-sized transfers of data using memory addressing. Accordingly, the user space 304 includes an application program 308 running on a processor, and memory 310, that is accessed by the processor, in which program code can be instantiated, and in which various data structures used by the program code are set up (e.g. variables, arrays, files, etc.).

The first peripheral space 302 includes a peripheral component 312 such as a peripheral card that can be connected to a bus of the main system of the user space 304. The peripheral component 312 can be further coupled to a peripheral system, as shown in FIG. 2. The peripheral component 312 therefore produces data that is used by the application program 308. Ordinarily the user program 308 would access the data using an API 316. Instead, the application program 308 can use the API 316 to configure the peripheral component 312 to clone its data residing in its local memory to the physical memory 310 located in the main memory (e.g. RAM 110). As part of the configuration process, the application program 308 indicates to the peripheral component (e.g. by configuring the driver) which data produced by the peripheral component is to be cloned, and the location(s) in the main system memory where the data of the peripheral component is to be cloned (written) in the main system memory 310. The API 316 can then commence the cloning operation when it is ready. Thereafter the peripheral component 312 can commence continuous cloning of the data, indicated by arrow 318 to the memory 310 without using any main system processor resources. The process can use a modular scatter gather DMA (MSGDMA) engine 314 on the peripheral component 312. In so doing, the application program 308 can directly access the data in memory 310, and the data will be as recent or more recent than would be realized using API calls to obtain the data, without the need to access the data residing in the local memory of the peripheral component 312. The end result is that there is little to no overhead to acquire the current data as it is directly available to the user by residing in its physical memory 310 in the user space 304. The MSGDMA engine 314 runs continuously, independent of what the application program 308 is doing. The cloned data in the memory 310 is used as input data for various tasks and processes of the application program 308. In some embodiments the peripheral component 302 can include sixty four analog channels that are digitized and cloned to memory 310.

Figure 3B:
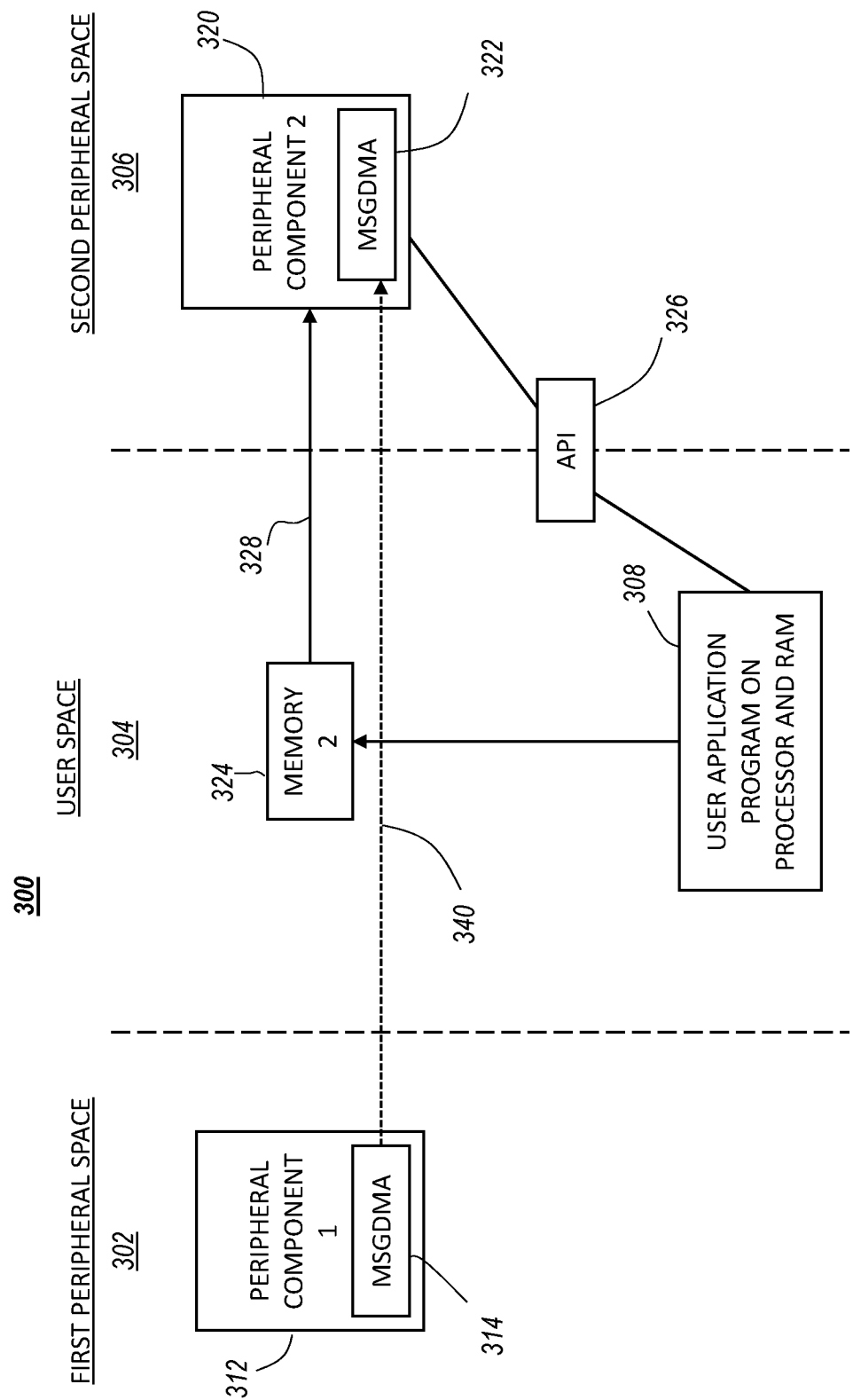
FIG. 3B is a system diagram showing cloning of data from physical memory of a main system to a second peripheral component, in accordance with some embodiment.

FIG. 3B is a system diagram showing a process for cloning data from physical memory 324 of a main system in user space 304 to a second peripheral component, in accordance with some embodiment. Specifically, the second peripheral component 320 in the second peripheral space 306 uses a MSGDMA engine 322 to fetch data from a memory location 324 (or locations) to clone the data from the memory 324 into a local memory of the second peripheral component 320, as indicated by arrow 328. The application program 308 can generate data used by the second peripheral component 320 (or even the first peripheral component 312) in real-time that the second peripheral component 320 uses. Ordinarily the application program 308, in addition maintaining the data in the memory 324 would have to write the data to the second peripheral component 320 via an API 326 for every transfer. Instead, the application program, as operated by the user, can access the second peripheral component 320 via the API 326 to configure the MSGDMA engine 322 to clone data from the memory 324 to the local memory in the second peripheral component 320. The second peripheral component 320 then operates on the data received in its local memory to provide signals or data to a second peripheral system. As with the first peripheral component 312, the cloning once initiated, is continuous until the application program stops the cloning (e.g. via API 326). The first and second peripheral components 312, 320 can be on the same bus or on different buses, and can access the same memory components (at different memory locations) or different memory components, depending on the specific architecture of the system. Additionally, the MSGDMA engine 322 of the second peripheral component 320 can fetch and receive data directly from the first peripheral component 312 local memory. Likewise, the MSGDMA engine 314 of the first peripheral component 312 can send data directly to the local memory of the second peripheral component 320. Both of these direct cloning operations between peripheral components, represented by arrow 340, eliminate the need to go through the system physical memory 324. This particular feature of the cloning operation is extremely useful if for example, peripheral component 320 does not have A/D converters that are present in peripheral component 312. In short, the system expands the capabilities of peripheral component 320 by "merging" components of peripheral system 312 into itself. The user can always write custom firmware residing in peripheral component 320 to make use of data received from the A/D converters of peripheral component 312 and processing the information in firmware.

In setting up the cloning operation, the application program 308 uses the APIs 316, 326 to configure the MSGDMA engines 314, 322. Upon instantiating the application program 308, memory spaces 310, 324 can be reserved for cloning operations, and the addresses of these memory locations is communicated to the MSGDMA engines 314, 322. Thereafter, the MSGDMA engines 314, 322 run autonomously and continuously reflect data in accordance with their configuration parameters.

Figure 4:
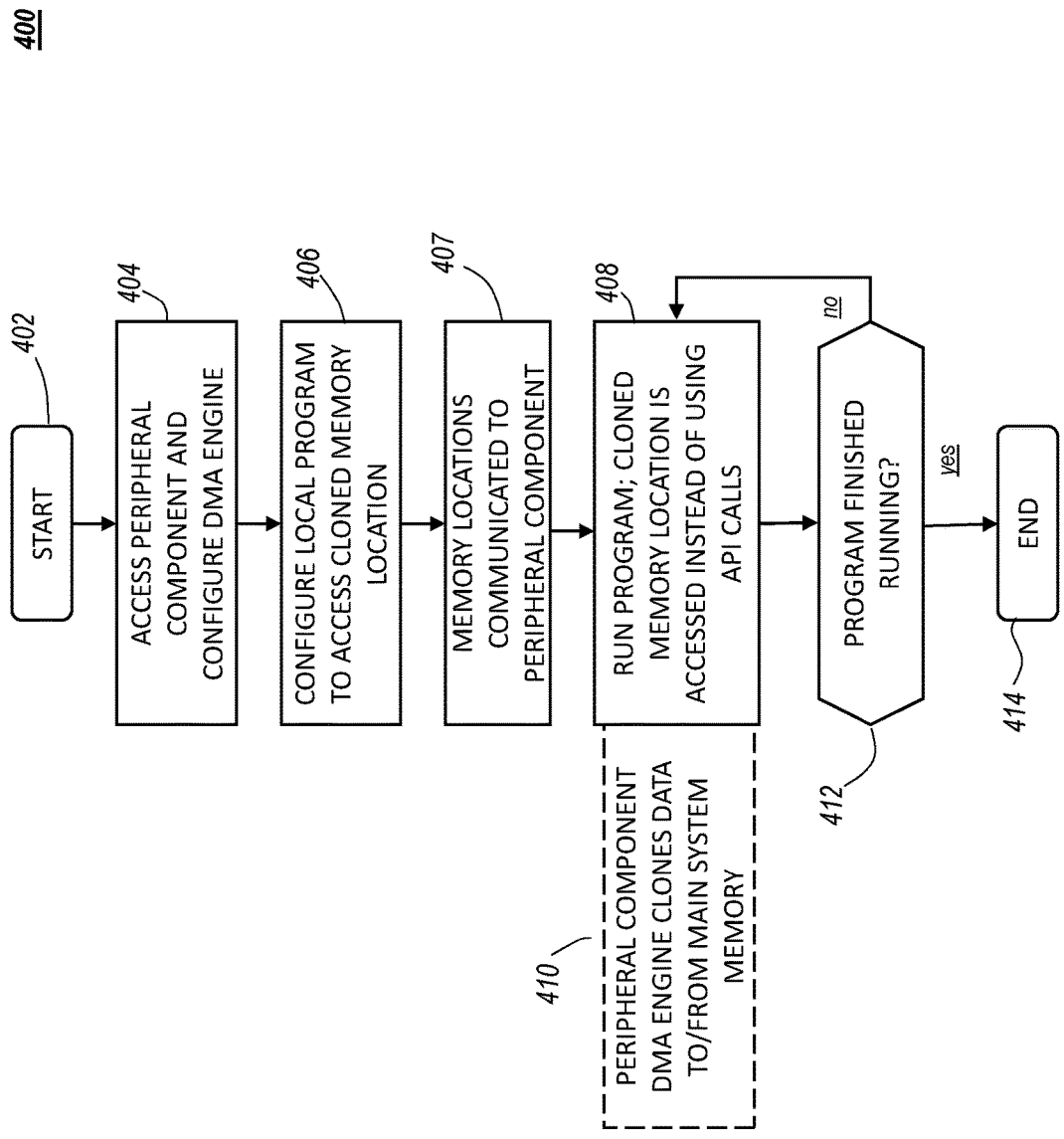
FIG. 4 is a flow chart diagram of a method for configuring a cloning operation in a computing system, in accordance with some embodiments.

FIG. 4 is a flow chart diagram of a method 400 for configuring and running a cloning operation in a computing system, in accordance with some embodiments. At the start 402 the main system and peripheral components are provided and connected via one or more buses, and powered up. Each peripheral component includes a local processor and memory, and the local processor is configurable to operate as a DMA/MSGDMA engine. The flow chart describes the process for one peripheral component, but those skilled in the art will understand that the same process can be duplicated for additional peripheral components.

In step 404 the peripheral component is accessed from the main system, such as by an API, to configure the cloning parameters in step 406. This process can involve defining, in the local memory of peripheral component, the memory locations of the local memory to be cloned. Since closing can occur in both directions (peripheral to main system, and main system to peripheral) the direction of the cloning operation can also be specified, or implied by specifying source and target locations for the cloning operation. In Step 406 the method further involves defining, in the physical memory of the main system, a dedicated memory space corresponding in size to the range of memory locations defined in the local memory of the first peripheral device. This step can be performed by the application program after receiving some parameters from the user, such as, for example, names of signals being cloned, the source, and so on. Once the memory location in the main system RAM is identified, then in step 407 the memory location information can be configured in the peripheral component's DMA/MSGDMA engine configuration. The memory locations do not have to be contiguous. Once the peripheral component is properly configured, in step 408 it will commence cloning data from its local memory (e.g. buffers, registers) to the physical memory locations of the main system that were specified in step 407. This avoids the need, and processing overhead, for API calls to transmit or receive the data between the main system and the peripheral component. As indicated in box 410, the peripheral component's DMA engine clones data to (or from) the specified memory locations in an ongoing basis. As indicated in step 412, the cloning operation continues until it is stopped, and then the method ends 414.

Figure 5:
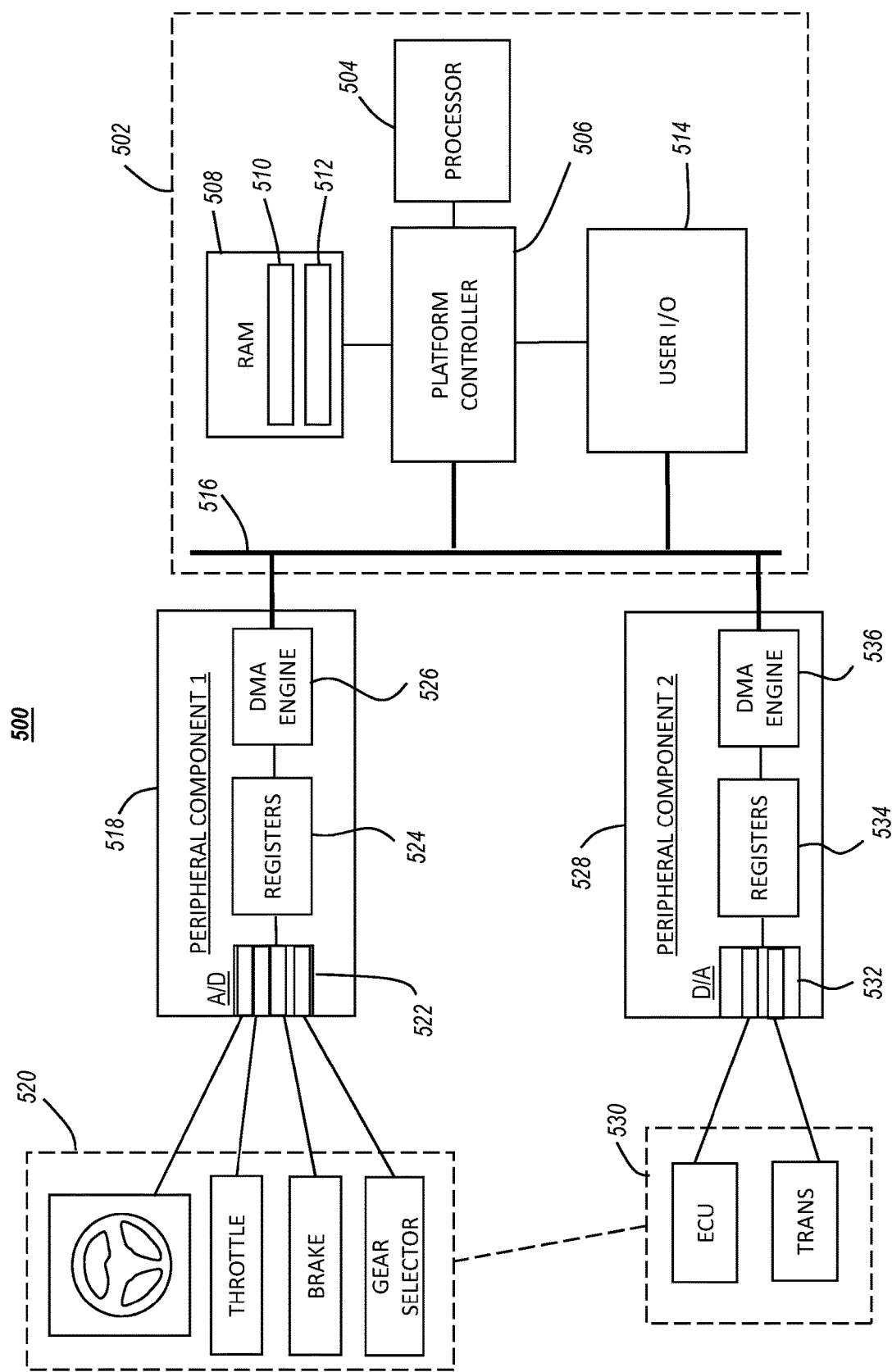
FIG. 5 shows an exemplary real-time simulator system including a main computing system and peripheral systems in which data cloning is used to reduce data latency and processor load, in accordance with some embodiments.

FIG. 5 shows an exemplary real-time simulator system 500 including a main computing system 502 and peripheral systems 520, 530 in which data cloning is used to reduce data latency and processor load, in accordance with some embodiments. The main computing system 502 includes a CPU having a processor 504, platform controller 506, RAM 508, and conventional input/output (I/O) devices (displays, audio, keyboard, pointing device, etc.). The platform controller 506 can be substantially equivalent to that of FIG. 1 (e.g. 112). The RAM 508 includes a first dedicated memory space 510 and a second dedicated memory space 512 The first dedicated memory space 510 can defined and reserved by the main computing system 502 for receiving data from the first peripheral component 518, and the processor will not write to the first memory space 510, and only read from the first memory space 510. The second dedicated memory space 512 is a defined by the main computing system 502 for writing data produced by the main computing system that is intended for the second peripheral system 530 and accessed directly by the second peripheral component 528. The main computing system 502 further includes a bus 516, which can be, for example, a PCI bus. The first and second peripheral components 518, 528 interface with the bus 516 and can be cards that are powered by the bus 516. Each of the peripheral components 518, 528 include a local processor and local memory and are operated, in part, according to firmware stored on each peripheral component 518, 528. The first peripheral component 518 is an interface between the main computing system 502 and the first peripheral system 520, and likewise the second peripheral component 528 is an interface between the main computing system 502 and the second peripheral system 530.

In this non-limiting exemplary system 500 the first and second peripheral systems 520, 530 include hardware elements that either generate signals (e.g. responsive to user manipulation) or are responsive to signals to control hardware elements. In particular, the exemplary system 500 represents a vehicle simulator in which real components of a vehicle are tested using simulation. For example, peripheral system 520 can include vehicle controls such as a steering assembly, a throttle system, a brake system, and a gear selector system (e.g. a "shifter"), among other elements. Each of these elements generate signals that are provided to the first peripheral component 518. Specifically, each of the signals are fed to a respective one of a plurality of A/D channels in an A/D converter system 522. Each channel of the A/D converter system 522 continuously samples its respective signal input and produces a signal value output that is written into an assigned local memory location in the local memory 524. That is, each A/D channel is mapped to a unique memory location in the local memory 524. The local processor of the first peripheral component 518 operates a DMA engine 526 according to firmware on the first peripheral component 518 that can be configured by the main computing system 502 using an API. Specifically, the DMA engine is operative to write data from memory location in the local memory 524 directly to corresponding memory location in the first dedicated memory space 510 of the RAM, using bus arbitration. The processor 504 of the main computing system 502, while executing the simulation program, can access the data in the first dedicated memory space 510 at any time, and it will be current, rather than the processor 504 having to call for the data through an API, as is conventional.

Similarly, the second peripheral system 530 contains elements that are being controlled/tested, responsive to signals produced by the second peripheral component 528. The processor 504 of the main computing system 502 processes signal data that it reads from the first dedicated memory space 510, and uses that signal data to generate additional signal data that it writes into the second dedicated memory space 512. In particular, there are a plurality of output values produced by the simulation application program being executed by the processor 504, and each one of these is written to an assigned location in the second dedicated memory space 512. The local processor of the second peripheral component 528 operates a DMA engine 536 that can directly access the second dedicated memory space 512, and write data from the second dedicated memory space 512 into corresponding locations in the local memory 534 of the second peripheral component 528. Each of the corresponding memory locations in the local memory 534 are mapped to a respective one of a plurality of D/A channels in a D/A system 532. The D/A channels run continuously to each output a respective analog signal at a level proportional to the signal value in its corresponding register of the local memory 534. These analog signals are provided to physical hardware being operated by the simulation system, such as, for example, and engine control unit (ECU), a transmission control unit (TRANS), and other such elements. It will be appreciated by those skilled in the art that elements being controlled can themselves produce feedback signals, which can be provided to the main computer system 502 through the first peripheral component 518, hence a dashed line is shown between the first peripheral system 520 and the second peripheral system 530 indicating that the hardware can be shared among these domains. Further, as indicated in FIG. 3B, by line 340, it is contemplated that the first peripheral component 518 can also write directly to the second peripheral component 528.

Accordingly, the inventive system can be used in a variety of applications where a main computing system relies of receiving data from a peripheral system in a timely manner, as is the case in real-time simulation systems. The inventive system also allows the main computing system to generate and provide data to a peripheral system in a timely manner while minimizing load on the processor in doing so. The disclosed inventive embodiments provide the benefit of freeing the main system processor from having to make API calls to send data to, or receive data from peripheral components in latency-sensitive applications, such as real-time simulation environments. This is especially critical in non-virtual simulation systems, where the main system is interfaced with real-world hardware being tested, evaluated, or otherwise used in conjunction with a simulation environment. Instead of using API calls to initiate every transfer, the processor running the application program can directly access data in the physical memory of main system with minimal overhead because the peripheral component that produces the data is configured to clone the data to the physical memory without any action by the main system processor. Likewise, the application system can write data to its physical memory, and that data is cloned to a peripheral component without any action by the main system processor. As a result, the inventive embodiments reduce the overhead to access the data and reduce the processing load on the main system processor, allowing the main system processor to perform other computation tasks. In addition, this means that the computing resources required to run a given simulation environment in real-time, without undue overhead, is reduced compared to the prior art systems that use API calls to read/write to peripheral components.

The claims appended hereto are meant to cover all modifications and changes within the scope and spirit of the present invention.

What is claimed is:

1. A method for cloning data in a real-time simulator system, the method comprising:
    defining, in a local memory of a first peripheral device, a range of memory locations of the local memory to be cloned;
    receiving, at the first peripheral device, a plurality of signals produced by one or more physical components of a first peripheral system;
    converting, by the first peripheral system, the plurality of signals produced by the physical components of a first peripheral system to a corresponding plurality of signal values and storing each one of the signal values in a respective assigned one of the range of memory locations of the local memory of the first peripheral device;
    defining, in a memory of a main computing system, a dedicated memory space corresponding in size to the range of memory locations defined in the local memory of the first peripheral device, wherein each one of the plurality of signal values of the first peripheral system are mapped to respective memory location in the dedicated memory space in the memory of the main computing system;
    writing, by a local processor on the first peripheral device, the signal values from the range of memory locations of the local memory of the first peripheral device directly to the dedicated memory space over a common bus of the main computing system;
    generating, by a processor of the main computing system, a plurality of output signal values for a second peripheral system that is, at least in part, based on the signal values in the first dedicated memory space;
    the processor of the main computing system writing the plurality of output signal values for the second peripheral system in a second dedicated memory space of the main computing system;
    a local processor of a second peripheral component directly accessing the second dedicated memory space to read from the second dedicated memory space; and
    the local processor of the second peripheral system writing output signal values of the plurality of output signal values read from the second dedicated memory space into corresponding memory locations in a local memory of the second peripheral component.

2. The method of claim 1, wherein writing to the dedicated memory space comprises writing to a dedicated memory space in a random access memory.

3. The method of claim 1, wherein the common bus is a peripheral component interface bus.

4. The method of claim 1, wherein writing directly to the dedicated memory space comprises writing to a processor cache of a processor of the computing system.

5. The method of claim 1, wherein writing to the dedicated memory space in the memory of the main computing system is performed asynchronously and continuously by the local processor of the first peripheral device.

6. The method of claim 1, wherein defining the range of memory locations of the local memory to be cloned is performed by a processor of the main computing system configuring the first peripheral device using an application programming interface.

7. The method of claim 1, further comprising:
    providing each one of the output signal values in the local memory of the second peripheral component to a respective one of a plurality of D/A channels of the second peripheral component;
    each one of the plurality of D/A channels generating an analog output based on the respective output signal value; and
    providing the analog output of each D/A channel to a respective hardware component of the second peripheral system.

8. A method for cloning data between a peripheral domain and a user domain operated on a main system, the peripheral component being interfaced with the main system by a bus system, the method comprising:
    configuring a peripheral component, through an application programming interface, by the main system, to directly write data in a plurality of local memory locations of the peripheral component to specified physical memory locations of the main system on an ongoing asynchronous basis;
    generating data by the peripheral component at the local memory locations of the peripheral component;
    the peripheral component generating a plurality of signal values from hardware elements, and wherein each of the plurality of signal values are written into an assigned respective memory location of the local memory location;
    the peripheral component writing the signal data of the local memory locations to the specified physical memory locations of the main system over the bus system using a modular scatter gather engine;
    a processor of the main system accessing the signal data in the specified physical memory locations using direct addressing to generate output signal values based on the signal data for a second peripheral system;

the processor of the main computing system writing the plurality of output signal values for the second peripheral system in a second dedicated memory space of the main computing system;

a local processor of a second peripheral component directly accessing the second dedicated memory space to read from the second dedicated memory space; and the local processor of the second peripheral system writing output signal values of the plurality of output signal values read from the second dedicated memory space into corresponding memory locations in a local memory of the second peripheral component.

9. The method of claim 8, wherein writing to the specified physical memory locations comprises writing to a random access memory.

10. The method of claim 8, wherein the bus is a peripheral component interface bus.

11. The method of claim 8, wherein writing directly to the specified memory locations comprises writing to a processor cache of a processor of the computing system.

12. The method of claim 8, wherein writing to the specific physical memory location in the physical memory is performed asynchronously and continuously by a local processor of the first peripheral component.

13. The method of claim 8, further comprising:
   providing each one of the output signal values in the local memory of the second peripheral component to a respective one of a plurality of D/A channels of the second peripheral component;
   each one of the plurality of D/A channels generating an analog output based on the respective output signal value; and
   providing the analog output of each D/A channel to a respective hardware component of the second peripheral system.

14. A system, comprising:
a main computing system having a processor, a physical memory, and a bus, the processor used to execute an application program;
the physical memory having defined therein a first dedicated memory space and a second dedicated memory space;
a first peripheral component that is interfaced with the bus of the main computing system and having a local processor, a local memory, and a analog to digital (A/D) converter system that includes a plurality of A/D channels, each one of the plurality of A/D channels configured to receive a respective analog signal from a hardware element of a first peripheral system and produce a signal value that is provided to a respective memory location in the local memory, wherein the local processor is configured to directly write the signal values in the local memory to corresponding memory locations in the first dedicated memory space using direct memory access on an ongoing and asynchronous manner;
wherein the processor of the main computing system is configured to read the signal values in the first dedicated memory space and generate a plurality of output signal values that are written into respective locations of the second dedicated memory space; and
a second peripheral component that is interfaced with the bus of the main computing system and having a local processor, a local memory, and a digital to analog (D/A) converter system that includes a plurality of D/A channels, the local processor of the second peripheral component configured to directly read from the second dedicated memory space and write the plurality of output signal values into respective locations in the local memory of the second peripheral component, each one of the respective locations in the local memory being associated with a respective one of the plurality of D/A channels, and wherein each one of the plurality of D/A channels produces an analog output having a value proportional to the respective one of the output signal values in the respective one of the memory locations.

\* \* \* \* \*